United States Patent
Betran et al.

(10) Patent No.: US 6,284,570 B1
(45) Date of Patent: Sep. 4, 2001

(54) METHOD OF MANUFACTURING A SEMICONDUCTOR COMPONENT FROM A CONDUCTIVE SUBSTRATE CONTAINING A PLURALITY OF VIAS

(75) Inventors: Mario Federico Cespedes Betran; Manuel Maximiliano Haro Reyes, both of Zapopan Jalisco; Miguel Angel Lopez Osorio, Guadalajara Jalisco; Luis Moreno Hagelsieb, Zapopan Jalisco; Jose de Jesus De Hijar, Zapopan Jalisco; Juan Rubio Serrano, Zapopan Jalisco; Juan Esteban Marquez Rodrigo; David Palafox Garcia, both of Guadalajara Jalisco, all of (MX)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/221,433

(22) Filed: Dec. 28, 1998

(51) Int. Cl.[7] ................. H01L 21/44; H01L 21/48
(52) U.S. Cl. .................. 438/112; 438/111; 438/113; 438/124; 438/126
(58) Field of Search ........................ 438/106–127

(56) References Cited

U.S. PATENT DOCUMENTS

| 5,467,253 | 11/1995 | Heckman | 361/761 |
| 5,530,284 | 6/1996 | Bailey | 257/670 |
| 5,776,798 | * | 7/1998 | Quan et al. | 438/112 |
| 5,789,280 | 8/1998 | Yokota | 438/123 |
| 6,054,338 | * | 4/2000 | Lee et al. | 438/110 |
| 6,057,175 | * | 5/2000 | Milla et al. | 438/113 |
| 6,080,602 | * | 6/2000 | Tani et al. | 438/114 |
| 6,087,202 | * | 7/2000 | Exposito et al. | 438/113 |
| 6,096,574 | * | 8/2000 | Smith | 438/106 |
| 6,143,981 | 11/2000 | Glenn | 174/52.4 |

* cited by examiner

Primary Examiner—John F. Niebling
Assistant Examiner—Viktor Simkovic
(74) Attorney, Agent, or Firm—Robert D. Atkins; Michael T. Wallace

(57) ABSTRACT

A semiconductor leadframe assembly (20A) and a method for manufacturing a semiconductor component (50) using the semiconductor leadframe assembly (20A). The semiconductor leadframe assembly (20A) includes a leadframe (10A) having flag portions (18A), lead portions (19A), and vias (14A). The vias (14A) serve as dielectric receiving areas. The assembly (20A) further includes semiconductor chips (21A) mounted on the flag portions (18A) and a dielectric material (33A) that covers the semiconductor chips (21A) and fills the vias (14A). The surface mount semiconductor component (50) is singulated from the semiconductor leadframe assembly (20A) to form electrical interconnects (18, 19) of the surface mount semiconductor component (50).

17 Claims, 4 Drawing Sheets

METHOD OF MANUFACTURING A SEMICONDUCTOR COMPONENT FROM A CONDUCTIVE SUBSTRATE CONTAINING A PLURALITY OF VIAS

FIELD OF THE INVENTION

The present invention relates, in general, to semiconductor components and, more particularly, to semiconductor leadframes.

BACKGROUND OF THE INVENTION

Semiconductor component manufacturers are constantly striving to lower the cost of manufacturing semiconductor components while improving their electrical and thermal performance characteristics. In addition, it is desirable for the semiconductor components to be small, light weight, and have a low profile. An important type of component meeting these requirements is a surface mount semiconductor component. This type of component has been developed to improve both the electrical and thermal performance characteristics and meet the size constraints of customers.

Typically, surface mount semiconductor components are manufactured by mounting semiconductor chips on a leadframe. Die bond pads of the semiconductor chips are electrically coupled to leadframe leads. The semiconductor chips and a portion of the leadframe are encapsulated by a packaging material. The leadframe leads extend from the packaging material; therefore, these types of semiconductor components are referred to as leaded semiconductor components.

Ensuring that the leadframe leads of these types of semiconductor components are coplanar and remain coplanar during subsequent processing steps is complex and results in higher manufacturing costs. If the leadframe leads are deformed, an open failure may occur at the solder joint between the leadframe lead and the footprint during mounting. To solve these problems, some manufacturers use different types of packaging structures such as the Molded Carrier Ring (MCR) package, the Guard ring Quad Flat Package (GQFP), or the Bumper Quad Flat Package (BQFP). However, these types of packages increase the external dimensions of the semiconductor component.

Accordingly, it would be advantageous to have a semiconductor leadframe and a cost efficient method for manufacturing a semiconductor component using the semiconductor leadframe. It would be of further advantage for the method to improve the coplanarity limitations of the leadframe leads. In addition, it would be advantageous for the semiconductor component to have a low profile and improved electrical and thermal performance characteristics over conventional surface mount semiconductor components.

DETAILED DESCRIPTION OF THE DRAWINGS

Generally, the present invention provides a semiconductor leadframe and a method for manufacturing a semiconductor component using the semiconductor leadframe. The semiconductor leadframe includes vias that serve as dielectric receiving areas and can be of various shapes and sizes. For example, the vias can be T-shaped, U-shaped, V-shaped, L-shaped, square, triangular, circular, rectangular, etc.

The method for manufacturing the semiconductor component includes creating flag portions and lead portions by forming vias in the semiconductor leadframe. Semiconductor chips are mounted on the flag portions of the leadframe. The semiconductor chips have die bond pads that are electrically coupled to lead portions of the leadframe. The semiconductor chips and a portion of the top surface of the leadframe are covered by an encapsulating material. In addition, the vias of the leadframe are filled with the encapsulating material. The leadframe having the semiconductor chips mounted thereto is singulated into individual surface mountable semiconductor components. The electrical interconnects of the semiconductor components are formed during the step of singulating the leadframe into semiconductor components.

Figure 1:
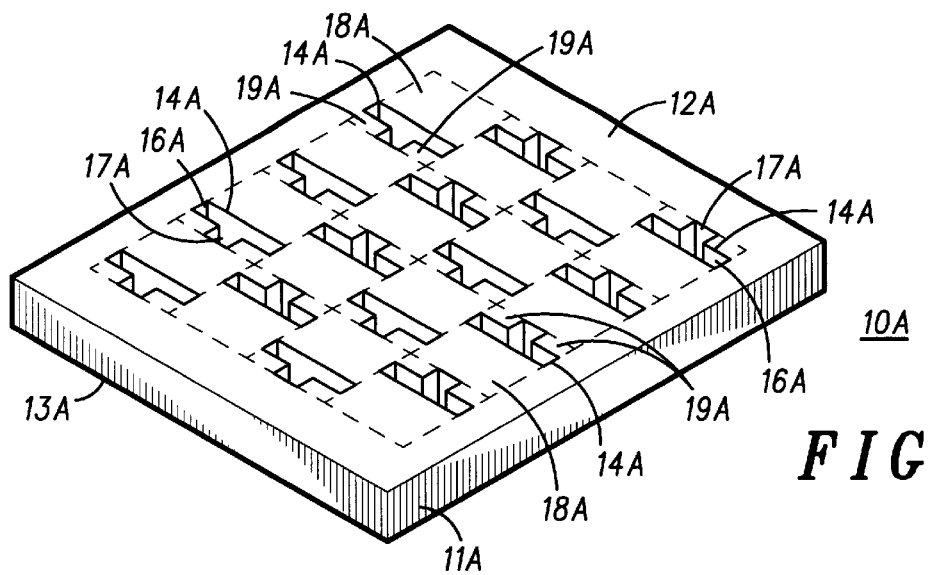
FIG. 1 is an isometric view of a semiconductor leadframe in accordance with an embodiment of the present invention.

FIG. 1 is an isometric view of a semiconductor leadframe 10A in accordance with an embodiment of the present invention. Leadframe 10A comprises a substrate 11A having a top surface 12A and a bottom surface 13A. Suitable materials for substrate 11A include copper, copper alloys, aluminum, aluminum alloys, or other materials capable of providing electrical conductivity and thermal conductivity. By way of example, the thickness of substrate 11A ranges between approximately 70 microns (um) and approximately 2500 um. Preferably, substrate 11A has a thickness of 900 um.

A plurality of vias 14A are formed in substrate 11A. Vias 14A are, for example, T-shaped having an elongated portion 16A and a protruding portion 17A substantially perpendicular to elongated portion 16A. Because vias 14A of this embodiment have a T-shape, they are referred to as T-shaped vias. Further, vias 14A extend from top surface 12A to bottom surface 13A. Techniques for forming vias 14A include drilling, machining, extruding, stamping, or the like. In this embodiment, T-shaped vias 14A are patterned as a plurality of columns and a plurality of rows. T-shaped vias 14A within a column are inverted with respect to T-shaped vias 14A in an adjacent column. In other words, the protruding portions of vias 14A within the same column extend in one direction while the protruding portions of vias 14A in an adjacent column extend in an opposite direction.

Leadframe 10A has flag portions 18A and lead portions 19A that are created by forming vias 14A in leadframe 10A. Dashed lines are used in FIG. 1 to indicate flag portions 18A and lead portions 19A of leadframe 10A.

Figure 2:
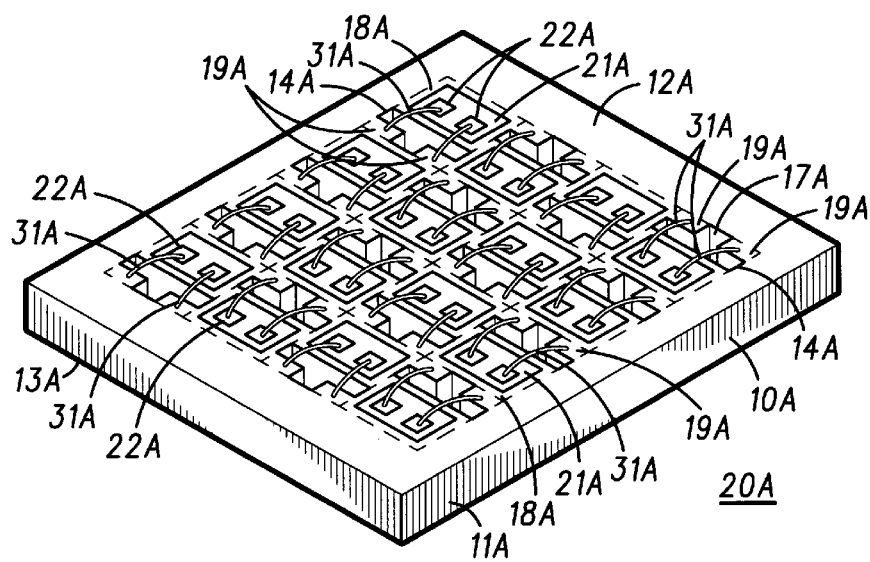
FIG. 2 is an isometric view of a portion of a semiconductor leadframe assembly during manufacture in accordance with an embodiment of the present invention.

FIG. 2 is an isometric view of a portion of a semiconductor leadframe assembly 20A during manufacture in accordance with an embodiment of the present invention. It should be understood that the same reference numerals are used in the figures to denote the same elements. FIG. 2 shows leadframe assembly 20A after the processing steps of die bonding and wire bonding.

Semiconductor chips 21A having die pond pads 22A are mounted on flag portions 18A of leadframe 10A. Techniques for attaching semiconductor chips 21A to flag portions 18A include soldering, adhesive bonding, etc. Die bond pads 22A of semiconductor chips 21A are electrically coupled to lead portions 19A via bond wires 31A. Wire bonding techniques are well known to those skilled in the art. Alternatively, semiconductor chips 21A can be coupled to lead portions 19A via metal clips instead of bond wires 31A.

Figure 3:
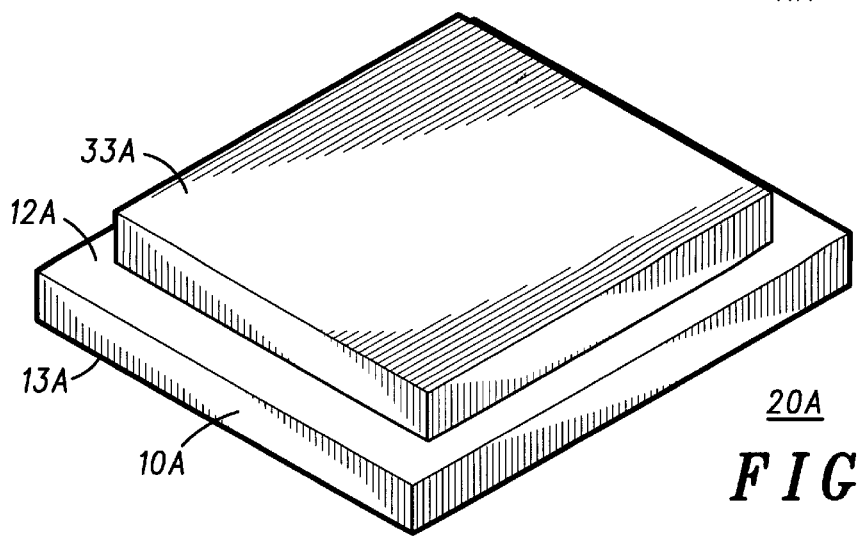
FIG. 3 is an isometric view of the semiconductor leadframe assembly of FIG. 2 at a later stage of manufacture.

FIG. 3 is an isometric view of semiconductor leadframe assembly 20A at a later stage of manufacture. Semiconductor chips 21A (FIG. 2), bond wires 31A (FIG. 2), and a portion of surface 12A are covered with an 5 encapsulating material 33A. In addition, vias 14A (FIG. 2) are filled with encapsulating material 33A. Preferably, encapsulating material 33A is a dielectric material such as, for example, ceramic, plastic, a ceramic filled polymer, mold compound, or the like, capable of providing electrical isolation. Since vias 14A are filled with a dielectric material, i.e., encapsulating material 33A, vias 14A serve as dielectric receiving areas. It should be noted that encapsulating material 33A is continuous over semiconductor chips 21A and over top surface 12A and may cover all of top surface 12A. By way of example encapsulating material 33A is disposed on leadframe 10A by placing leadframe 10A on a one-sided mold cavity and injecting encapsulating material 33A into the one-sided mold cavity to encapsulate semiconductor chips 22A, bond wires 31A, and fill vias 14A.

Optionally, encapsulating material 33A can be disposed in vias 14A after vias 14A are formed and prior to attaching semiconductor chips 21A and disposed over bond wires 31A and chips 21A after the steps of die bonding and wire bonding. This results in vias 14A being filled with encapsulating material 33A prior to the steps of die bonding and wire bonding.

Leadframe 10A, semiconductor chips 21A, bond wires 31A, and encapsulating material 33A form semiconductor leadframe assembly 20A.

Figure 4:
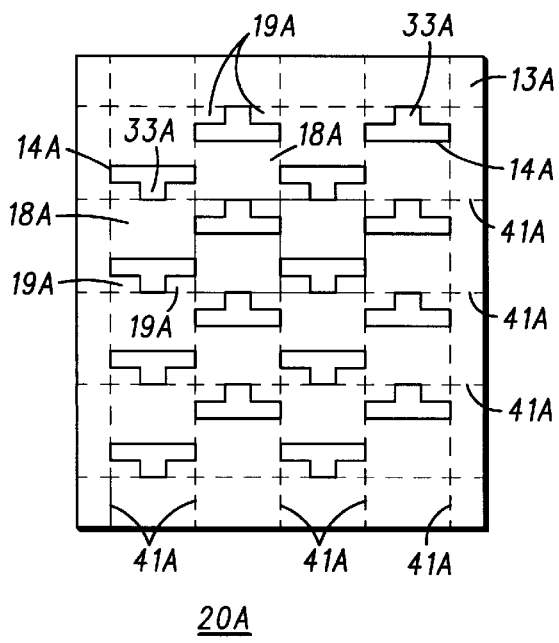
FIG. 4 is a bottom view of the semiconductor leadframe assembly of FIG. 2 at a later stage of manufacture.

FIG. 4 is a bottom view of semiconductor leadframe assembly 20A. What is shown in FIG. 4 is bottom surface 13A of semiconductor leadframe 10A and T-shaped vias 14A filled with encapsulating material 33A. Semiconductor leadframe assembly 20A is singulated into a plurality of semiconductor components. Techniques for singulating assembly 20A into individual semiconductor components include, for example, cutting, sawing, or the like.

Cut paths, shown as dashed lines 41A in FIG. 4, illustrate paths along which assembly 20A is cut to form singulated semiconductor components. By way of example, a diamond cutter (not shown) saws assembly 20A along cut paths 41A to form sixteen semiconductor components. Alternatively, a laser (not shown) can be used to cut assembly 20A along cut paths 41A.

It should be understood, the number of semiconductor a components that can be obtained from leadframe assembly 20A is dependent upon the size of leadframe 10A, i.e., the number can be either decreased or increased by varying the size of leadframe 10A and the number of vias formed in leadframe 10A.

Figure 5:
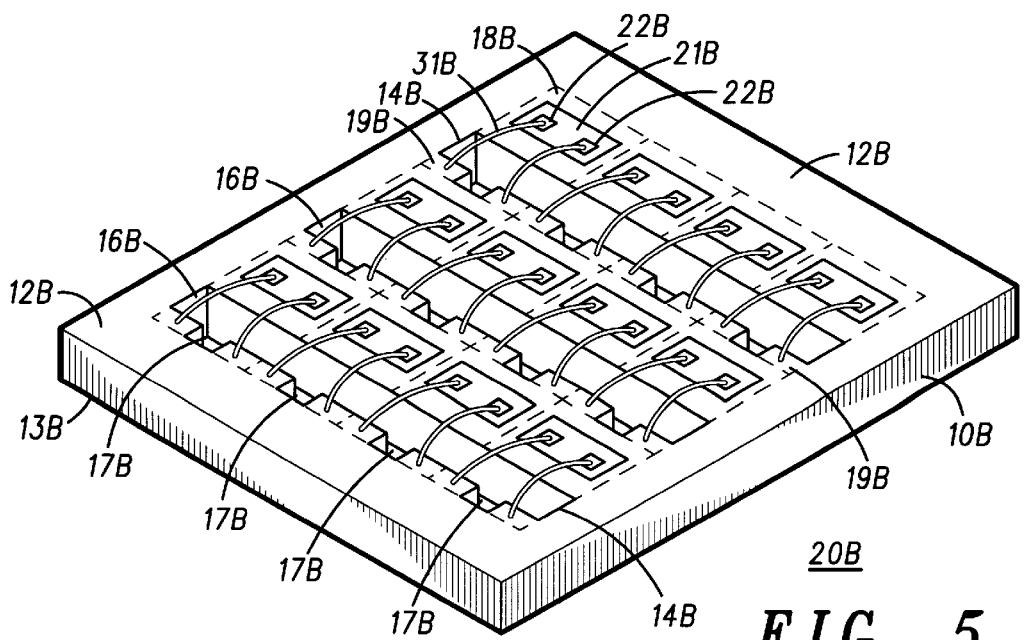
FIG. 5 is an isometric view of a portion of a semiconductor leadframe assembly during manufacture in accordance with another embodiment of the present invention.

FIG. 5 is an isometric view of a portion of a semiconductor leadframe assembly 20B during manufacture in accordance with another embodiment of the present invention. It should be noted that the letter "A" which was appended to the reference numbers of FIGS. 1–4 is replaced by the letter "B" in FIGS. 5 and 6 to distinguish between the corresponding features of the two embodiments shown in these figures. Assembly 20B comprises a leadframe 10B having a top surface 12B, a bottom surface 13B, and vias 14B.

Vias 14B extend from top surface 12B to bottom surface 13B. Vias 14B are comb-shaped and have an elongated portion 16B and teeth 17B. In this embodiment, the protruding portions of vias 14B, i.e., teeth 17B, extend in the same direction with respect to each other. Leadframe 10B has flag portions 18B and lead portions 19B that are created by forming vias 14B in leadframe 10B. Dashed lines are used in FIG. 5 to designate flag portions 18B and lead portions 19B of leadframe 10B.

Assembly 20B further includes semiconductor chips 21B mounted on flag portions 18B, wherein semiconductor chips 21B have die bond pads 22B that are electrically coupled to lead portions 19B via bond wires 31B.

Figure 6:
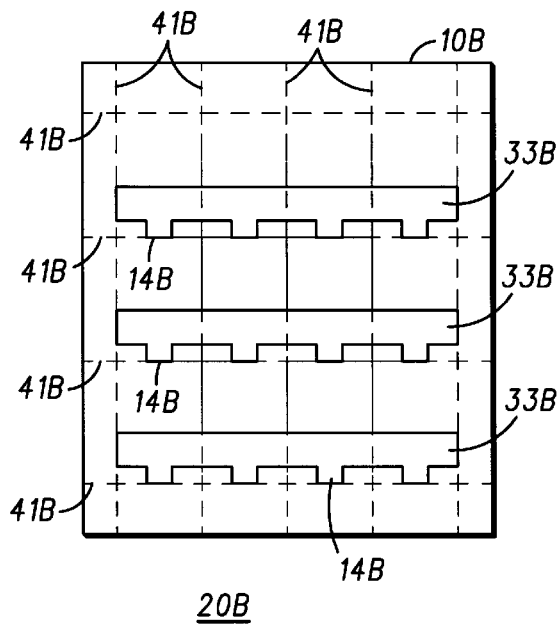
FIG. 6 is a bottom view of the semiconductor leadframe assembly of FIG. 5 at a later stage of manufacture.

FIG. 6 is a bottom view of semiconductor leadframe assembly 20B at a later stage of manufacture. More particularly, FIG. 6 shows assembly 20B after an encapsulating material 33B is disposed on a portion of leadframe assembly 20B and into vias 14B. Preferably, encapsulating material 33B is a dielectric material capable of providing electrical isolation. Although not shown, encapsulating material 33B covers semiconductor chips 21B and bond wires 31B and is preferably continuous over top surface 12B of leadframe 10B.

Cut paths, shown as dashed lines 41B in FIG. 6, illustrate paths along which assembly 20B is cut. Similar to the process for singulating assembly 20A (FIG. 4), a diamond cutter (not shown) can be used to cut assembly 20B along cut paths 41B to form semiconductor components similar in structure to semiconductor component 50 illustrated in FIG. 7. Although the embodiment shown in FIGS. 5 and 6 illustrate a leadframe assembly for manufacturing twelve semiconductor components, it should be understood that this is not a limitation of the present invention.

Figure 7:
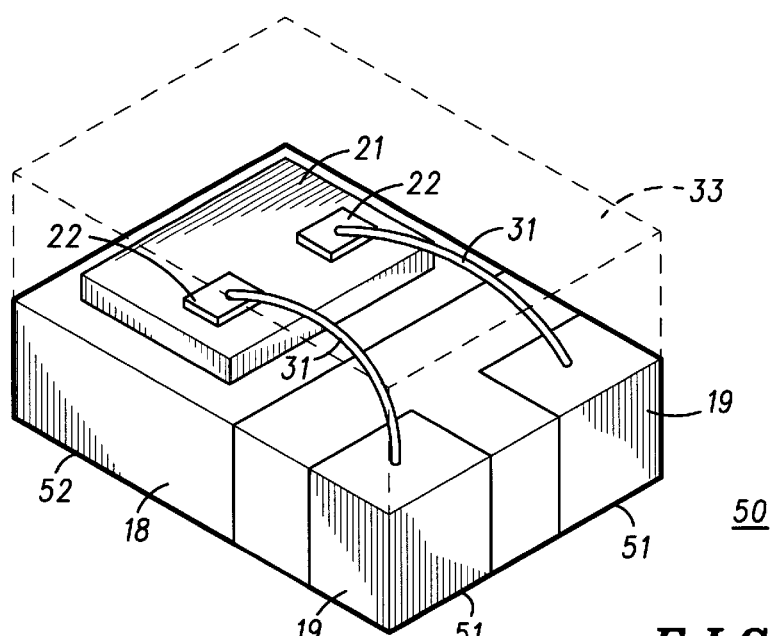
FIG. 7 is an isometric view of a semiconductor component manufactured in accordance with the present manufacture.

FIG. 7 is an isometric view of semiconductor component 50 manufactured in accordance with the present invention. As discussed hereinbefore, semiconductor component 50 can be manufactured by singulating assembly 20A (FIGS. 2–4) or assembly 20B (FIGS. 5 and 6). Elements of semiconductor component 50 have the same reference numbers (minus the appended alphabetic character) as corresponding elements of assembly 20A (FIGS. 2–4) and assembly 20B (FIGS. 5 and 6).

Semiconductor component 50 includes electrical interconnects 19 and a heat sink 18 having a semiconductor chip 21 mounted thereon. Die bond pads 22 of semiconductor chip 21 are coupled to electrical interconnects 19 via bond wires 31. Semiconductor component 50 further includes an encapsulating material 33 that covers semiconductor chip 21, bond wires 31, portions of heat sink 18, and portions of electrical interconnects 19. Encapsulating material 33 electrically isolates electrical interconnects 19 and heat sink 18 from each other. In addition, encapsulating material 33 protects semiconductor chip 21 from moisture, mechanical stresses, contamination, conductive debris, etc. Although encapsulating material 33 typically is opaque, it is shown clear to show the elements inside of semiconductor component 50.

In the example of manufacturing semiconductor component 50 using assembly 20A, heat sink 18 and electrical interconnects 19 are formed from flag portions 18A and lead portions 19A, respectively. Heat sink 18 and electrical interconnects 19 are formed during the process of cutting assembly 10A. Accordingly, bottom surfaces 51 of electrical interconnects 19 are coplanar with a bottom surface 52 of heat sink 18. However, this is not a limitation of the present invention, i.e., bottom surfaces 51 and 52 do not have to be coplanar.

During the operation of semiconductor component 50, heat sink 18 provides a thermal path for removing heat generated by semiconductor chip 21. Because heat sink 18 is formed from a material having both thermally and electrically conductive properties, heat sink 18 may also function as an electrical interconnect of semiconductor component 50.

Figure 8:
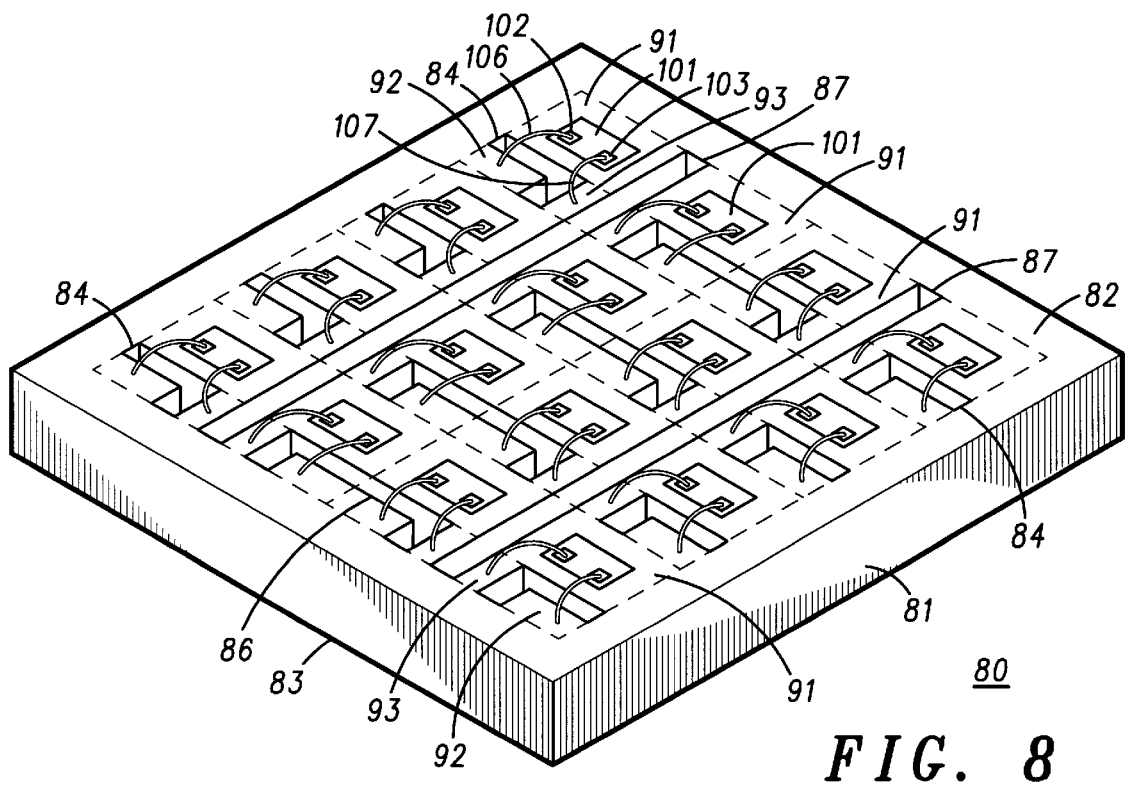
FIG. 8 is an isometric view of a portion of a semiconductor leadframe assembly during manufacture in accordance with another embodiment of the present invention.

FIG. 8 is an isometric view of a portion of a semiconductor leadframe assembly 80 during manufacture in accordance with another embodiment of the present invention. Assembly 80 comprises a leadframe 81 having a top surface 82, a bottom surface 83, L-shaped vias 84, U-shaped vias 86, and rectangular-shaped vias 87. Leadframe 81 is preferably formed from a copper material.

Vias 84, 86, and 87 extend from top surface 82 to bottom surface 83 and serve as dielectric receiving areas. Rectangular-shaped vias 87 are patterned along a first direction. U-shaped vias 86 are patterned along a direction perpendicular to the first direction, i.e., a second direction. U-shaped vias 86 are spaced apart from L-shaped vias 84 by portions of rectangular-shaped vias 87. Techniques for forming vias 84, 86, and 87 are similar to the techniques for forming vias 14A of FIG. 1.

Leadframe 81 has die flag portions 91, lead portions 92, and lead portions 93 that are created by forming vias 84, 86, and 87 in leadframe 81. Dashed lines are used in FIG. 8 to designate flag portions 92 and lead portions 93 of leadframe 81.

Assembly 80 further includes a plurality of semiconductor chips 101 mounted on flag portions 91, wherein semiconductor chips 101 have die bond pads 102 and 103. Die bond pads 102 are electrically coupled to lead portions 92 via bond wires 106 and die bond pads 103 are electrically coupled to lead portions 93 via bond wires 107. Wire bonding techniques and die bonding techniques are well known to those skilled in the art.

Figure 9:
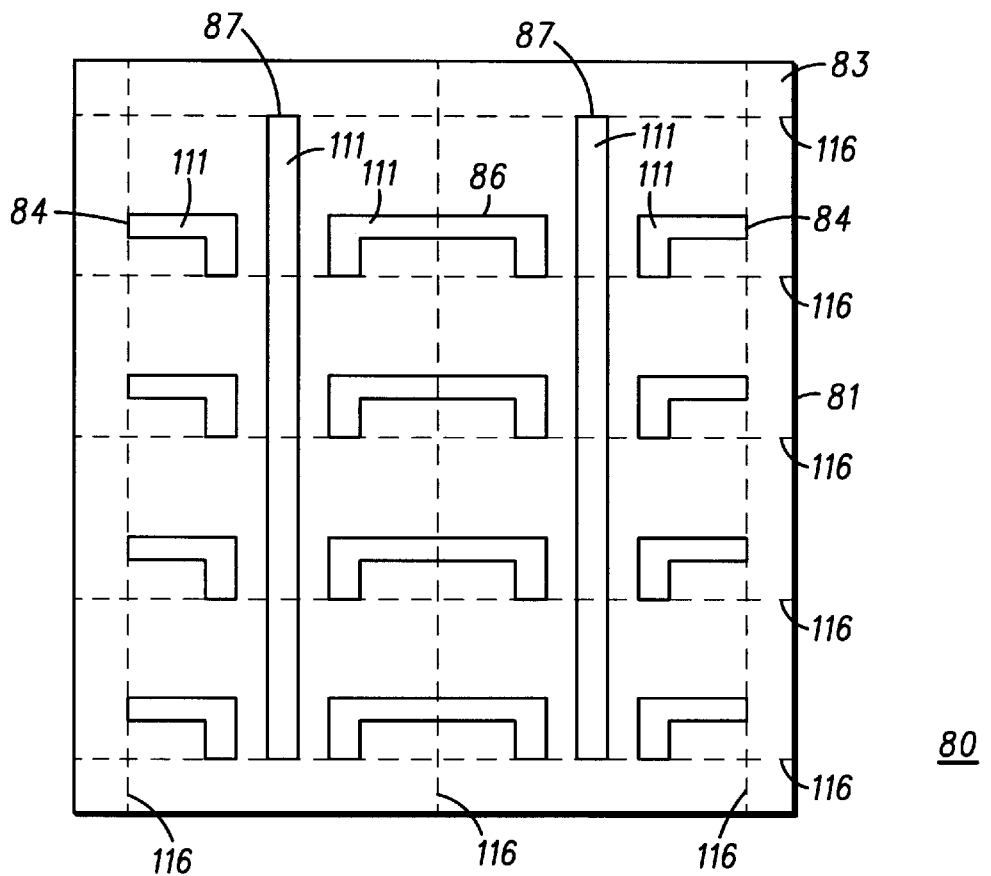
FIG. 9 is a bottom view of the semiconductor leadframe assembly of FIG. 8 at a later stage of manufacture.

FIG. 9 is a bottom view of semiconductor leadframe assembly 80 at a later stage of manufacture. More particularly, FIG. 9 shows assembly 80 after an encapsulating material 111 has been disposed on a portion of leadframe 81 and into vias 84, 86, and 87. Preferably, encapsulating material 111 is a dielectric material capable of providing electrical isolation. Although not shown, encapsulating material 111 is preferably continuous over top surface 82 and covers semiconductor chips 101, bond wires 106, and bond wires 107.

Cut paths, shown as dashed lines 116 in FIG. 9, illustrate paths along which assembly 80 is cut. A cutting tool (not shown) such as, for example, a diamond cutter or laser, cuts assembly 80 along cut paths 116 to form eight semiconductor components similar in structure to semiconductor component 120 illustrated in FIG. 10. Although this embodiment shows a leadframe assembly for manufacturing eight semiconductor components, it should be understood this is not a limitation of the present invention.

Figure 10:
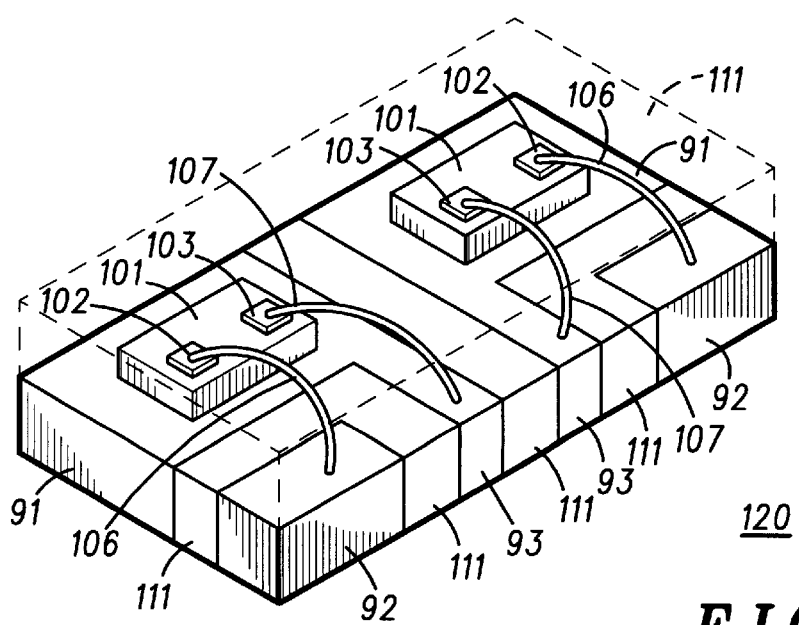
FIG. 10 is an isometric view of a semiconductor component manufactured in accordance with the present invention.

FIG. 10 is an isometric view of semiconductor component 120 manufactured in accordance with the present invention. It should be understood that the same reference numerals are used in the figures to denote the same elements.

Semiconductor component 120 is a multi-chip semiconductor component that includes lead portions 92 and 93 and flag portions 91 having semiconductor chips 101 mounted thereon. Die bond pads 102 of semiconductor chips 101 are coupled to lead portions 92 via bond wires 106, and die bond pads 103 of semiconductor chips 101 are coupled to lead portions 93 via bond wires 107.

Semiconductor component 120 further includes an encapsulating material 111 that covers semiconductor chips 101 and bond wires 106 and 107. Encapsulating material 111 electrically isolates lead portions 92 and 93 and flag portions 91 from each other. In addition, encapsulating material 111 protects semiconductor chips 101 from moisture, mechanical stresses, contamination, conductive debris, etc. Although encapsulating material 111 typically is opaque, it is shown clear to show the elements inside of semiconductor component 120.

During the operation of semiconductor component 120, flag portions 91 and lead portions 93 cooperate to form heat sinks for removing heat generated by semiconductor chips 101. In addition, flag portions 91 and lead portions 93 cooperate to form the electrical interconnects of semiconductor component 120. Further, lead portions 92 are the electrical interconnects of semiconductor component 120. It should be noted that the electrical interconnects and heat sinks of semiconductor component 120 are formed during the singulation of assembly 80. The bottom surfaces of portions 91, 92, and 93 are coplanar making semiconductor component 120 a surface mountable semiconductor component. It should be understood that although it is preferable that the bottom surfaces of portions 91, 92, and 93 be coplanar, this is not a limitation of the present invention.

By now it should be appreciated that a semiconductor leadframe and a method for manufacturing a semiconductor component using the semiconductor leadframe have been provided. An advantage of the present invention is that it provides a method for manufacturing a semiconductor component which is simple and cost efficient. Prior art leaded surface mount semiconductor components utilize a lead bending operation to form their electrical interconnects. Lead bending operations are complex and increase cycle time, resulting in higher manufacturing costs. The method of the present invention efficiently forms electrical interconnects without a need for a lead bending operation. The electrical interconnects are formed during the process of singulating the leadframe assembly into semiconductor components. Further, the semiconductor component manufactured in accordance with the present invention has low lead inductance and a low profile compared to prior art leaded surface mount semiconductor components that have leadframe leads extending from their packaging material.

What is claimed is:

1. A method of manufacturing a semiconductor component having an electrical interconnect, comprising the steps of:

providing a substrate containing vias in the substrate from a first surface of the substrate to a second surface of the substrate;

coupling at least one semiconductor chip to the substrate;

disposing an encapsulating material over the at least one semiconductor chip, wherein the encapsulating material is continuous over the substrate; and singulating the substrate to form the semiconductor component, wherein the step of singulating also forms the electrical interconnect of the semiconductor component.

2. The method of claim 1, wherein the step of disposing the encapsulating material includes disposing the encapsulating material into the vias.

3. The method of claim 1, further including the step of coupling a bond pad of the at least one semiconductor chip to a lead portion of the substrate.

4. The method of claim 1, wherein the step of singulating includes sawing the substrate to form a heat sink of the semiconductor component from a portion of the substrate, and wherein a surface of the heat sink is substantially coplanar with a surface of the electrical interconnect.

5. The method of claim 1, further including the step of forming T-shaped vias in the substrate, wherein the step of disposing the encapsulating material includes disposing the encapsulating material into the T-shaped vias and wherein a lead portion of the substrate is adjacent to a first portion of the T-shaped vias and a flag portion of the substrate is adjacent to a second portion of the T-shaped vias.

6. The method of claim 1, further including the steps of:
   forming L-shaped vias in the substrate;
   forming U-shaped vias in the substrate; and
   forming rectangular-shaped vias in the substrate, wherein the rectangular-shaped via is between the L-shaped via and the U-shaped via, and wherein the at least one semiconductor chip is a plurality of semiconductor chips.

7. The method of claim 6, wherein the step of singulating the substrate includes sawing the substrate to form a heat sink from a flag portion of the substrate, wherein the at least one semiconductor chip is coupled to the heat sink.

8. The method of claim 7, wherein the step of disposing the encapsulating material over the at least one semiconductor chip includes disposing the encapsulating material into the L-shaped vias, the U-shaped vias, and the rectangular-shaped vias and wherein the encapsulating material electrically isolates the heat sink and the electrical interconnect of the semiconductor component from each other.

9. A method for manufacturing a semiconductor component, comprising the steps of:
   providing a substrate;
   forming comb-shaped vias in the substrate;
   mounting a plurality of semiconductor chips on corresponding flag portions of the substrate; and
   singulating the substrate to form the semiconductor component.

10. The method of claim 9, further including the step of disposing a dielectric material over the plurality of semiconductor chips and into the comb-shaped vias, wherein the dielectric material is continuous over the plurality of semiconductor chips and over a surface of the substrate.

11. The method of claim 9, wherein the step of singulating includes sawing the substrate to form a heat sink from a flag portion of the substrate and an electrical interconnect from a lead portion of the substrate, wherein a surface of the heat sink is coplanar with a surface of the electrical interconnect.

12. The method of claim 9, wherein the step of forming comb-shaped vias in the substrate includes forming the comb-shaped vias extending from a first surface of the substrate to a second surface of the substrate and wherein lead portions of the substrate are spaced apart from the flag portions of the substrate by the comb-shaped vias.

13. The method of claim 9, further including the step of coupling bond pads of the plurality of semiconductor chips to corresponding lead portions of the substrate.

14. A method of manufacturing semiconductor components providing electrical interconnects formed during a singulation process, the method comprising:
   providing a conductive substrate containing vias in the conductive substrate from a first surface of the substrate to a second surface of the substrate;
   attaching at least one semiconductor device to the first surface of the substrate to form a semiconductor assembly;
   encapsulating the semiconductor assembly; and singulating the semiconductor assembly to form the semiconductor components, wherein singulating the semiconductor assembly forms electrical interconnects.

15. The method of claim 14, wherein providing the conductive substrate further includes:
   forming flag portions in the conductive substrate; and
   forming lead portions in the conductive substrate.

16. The method of claim 14, wherein attaching the at least one semiconductor device to the conductive substrate comprises forming an electrically conductive connection between the semiconductor device and the conductive substrate.

17. The method of claim 14, wherein singulating the semiconductor assembly to form the semiconductor components comprises separating the semiconductor assembly along predefined cut paths.

* * * * *